United States Patent [19]
Kootstra et al.

[11] Patent Number: 5,416,434
[45] Date of Patent: May 16, 1995

[54] ADAPTIVE CLOCK GENERATION WITH PSEUDO RANDOM VARIATION

[75] Inventors: Steve Kootstra; Daniel J. Powers, both of McMinnville, Oreg.

[73] Assignee: Hewlett-Packard Corporation, Palo Alto, Calif.

[21] Appl. No.: 26,716

[22] Filed: Mar. 5, 1993

[51] Int. Cl.$^6$ ............................................. H03K 3/84
[52] U.S. Cl. .................................. 327/113; 327/164; 327/145; 395/550; 395/650
[58] Field of Search .................. 307/265, 268; 328/28, 328/63, 72, 74; 395/550, 600, 650; 364/254.8, 260.2, 270.8

[56] References Cited
U.S. PATENT DOCUMENTS

| | | | |
|---|---|---|---|
| 4,050,096 | 9/1977 | Bennett et al. | 364/200 |
| 4,509,120 | 4/1985 | Daudelin | 364/200 |
| 4,815,018 | 3/1989 | Reinhardt et al. | 364/701 |
| 4,870,562 | 9/1989 | Kimoto et al. | 364/200 |
| 4,984,186 | 1/1991 | Moerder | 364/721 |
| 5,115,189 | 5/1992 | Holcomb | 324/121 |
| 5,163,146 | 11/1992 | Antanaitis et al. | 395/550 |
| 5,222,239 | 6/1993 | Rosch | 395/750 |
| 5,237,676 | 8/1993 | Arimilli et al. | 395/550 |
| 5,263,172 | 11/1993 | Olnowich | 395/800 |

OTHER PUBLICATIONS

"Embedded Microcontrollers and Processors", vol. II, pp. 24–59, 24–99, Intel, order #270354-005, Oct. 1991.

Primary Examiner—Steven L. Stephan
Assistant Examiner—Shawn Riley
Attorney, Agent, or Firm—Curtis G. Rose

[57] ABSTRACT

Adaptive clock generator including a master clock. A control means detects the current operating mode and, in response, provides a corresponding integer output N. A programmable pulse generator provides an output clock signal comprising a "high" pulse having a predetermined width followed by a "low" pulse having a width of N master clock periods. A dithered clock signal may be provided when the control means provides an integer output N selected from a set of integer values. Preferably, N is selected in a random or pseudo-random manner.

4 Claims, 3 Drawing Sheets

ADAPTIVE CLOCK GENERATION WITH PSEUDO RANDOM VARIATION

BACKGROUND

Modern controller design is faced with a classic tradeoff. The demand for more processing throughput forces the use of controllers that are either faster, wider, or both. All other things being equal, this results in both increased power consumption and increased levels of radiated emissions.

A faster system clock increases throughput at the expense of increased power consumption and increased levels of radiation. However, the faster clock may be necessary only during time-critical processes, such as interrupt processing.

Conversely, there may be instances when a slower system clock is preferred. Memory circuits may have an access time which is longer than the typical period of a system clock. To give the memory more time to respond, a "wait" state can be used, effectively halving the performance of the system during memory access.

Likewise, a fast system clock can cause increased levels of radiated emissions. Many clocks in the past have provided for a way of dynamically varying, or "dithering" their frequencies to spread their radiated emissions over a greater bandwidth. However, these clocks have typically been relatively complex or expensive.

There is a need for a system clock which can adapt its frequency to respond to the present requirements of the processor, and provide for dithering.

SUMMARY

The present invention satisfies this need by providing an adaptive clock signal responsive to the current operating mode of the controller. Thus, for example, the clock signal can have a higher frequency during interrupt processing. Likewise, the clock signal can have a lower frequency during memory access, allowing the use of relatively slow memory without using wait states, and with the benefits of decreasing power consumption and radiated emissions. Furthermore, the clock signal can have a "dithered" frequency, decreasing the magnitude of radiated emissions in any specific frequency range while maintaining an acceptable average clock frequency.

Therefore, an adaptive clock generator includes a master clock. A controller detects the processor's current operating mode and, in response, provides an integer output N. A programmable pulse generator provides an output clock signal comprising a "high" pulse having a predetermined width followed by a "low" pulse having a width of N master clock periods. In this manner, the period of each adaptive clock cycle can be individually controlled by varying N.

The clock generator may provide a dithered clock signal in a similar manner. The clock generator includes a master clock. A control means provides an integer output N selected from a set of integer values. A programmable pulse generator provides an output clock signal comprising a "high" pulse having a predetermined width followed by a "low" pulse having a width of N master clock periods. By selecting N in a random or pseudo-random manner, the resulting output clock signal can be varied on a per-cycle basis.

Dithering the clock signal may be one of the operating modes of the adaptive clock generator. For example, when the controller is not detecting an operating mode which requires a specific clock frequency (as for the memory access or the interrupt routine processing examples, given above), the controller can operate in the dithering mode.

Preferably, the predetermined width of the high pulse is equal to one width of a master clock period. In such a case, the master clock frequency must be at least twice as great as the greatest desired adaptive clock frequency. Alternatively, the master clock may have a frequency only as great as the greatest desired dithered frequency if a local frequency doubler is used. This alternative has the benefit of limiting the circuit area operating at the higher frequency, and thus reducing radiated emissions.

These and other features, aspects, and advantages of the present invention will become better understood with reference to the following description and appended claims.

DESCRIPTION

Figure 1:
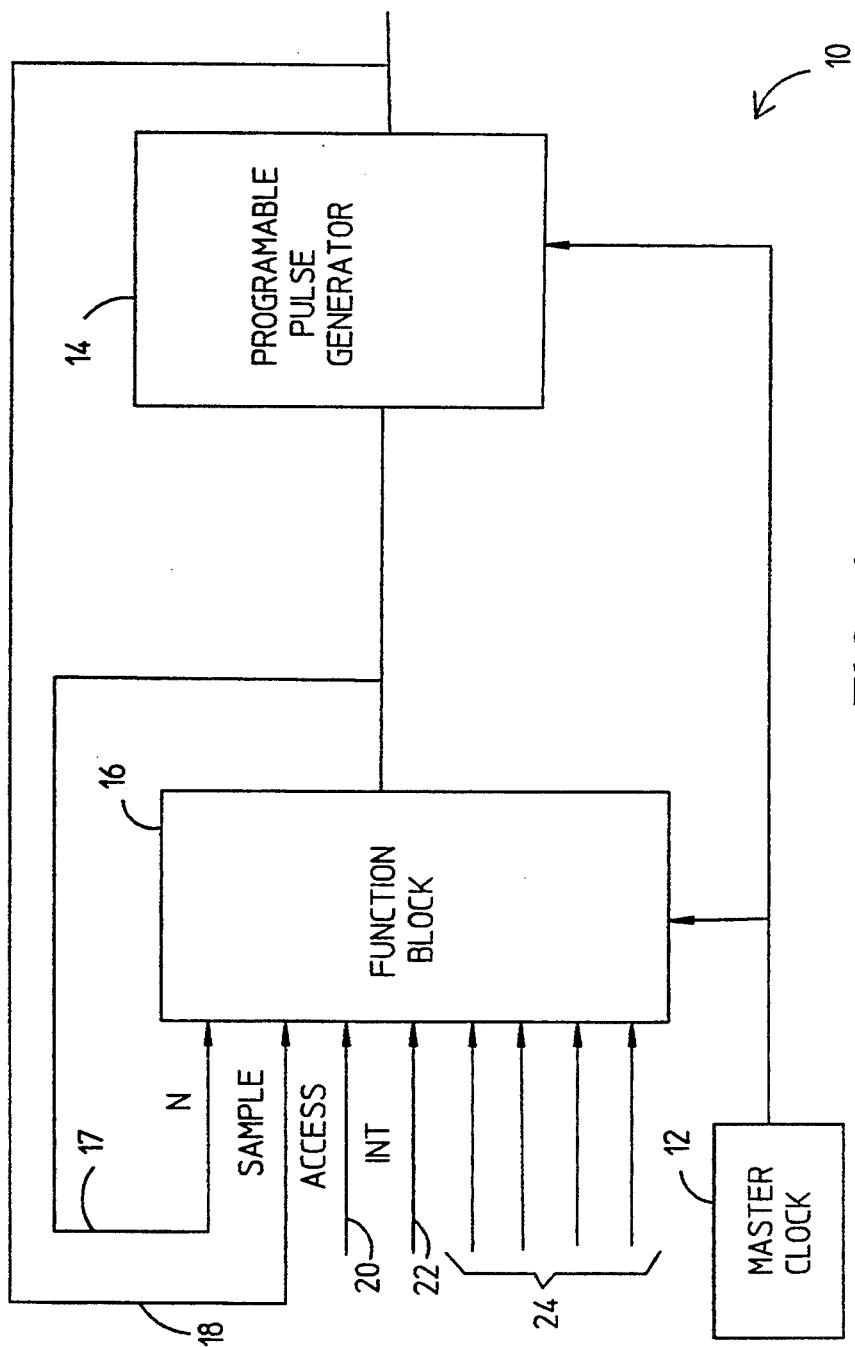
FIG. 1 shows a general block diagram of an adaptive clock generation system for generating an adaptive clock signal.

Referring to the drawings, FIG. 1 shows a block diagram of an adaptive clock generating system 10 for generating an adaptive clock signal. The system includes three main elements: a master clock 12, a programmable pulse generator 14, and a function block 16.

The master clock 12 provides a periodic signal.

The programmable pulse generator 14 provides a train of pulses, each high pulse having a predetermined width, and being followed by a low pulse being N master clock periods ($T_m = 1/F_m$) in width. Preferably, the predetermined width of the high pulse is equal to one width of a master clock period. In such a case, the master clock frequency must be at least twice as great as the greatest desired adaptive clock frequency. In such a case, the master clock frequency must have a frequency $F_m$ less than or equal to that corresponding to the minimum pulse time suitable for the digital circuit.

The programmable pulse generator receives the periodic signal from the master clock 12 and the value N from the function block 16.

Figure 2:
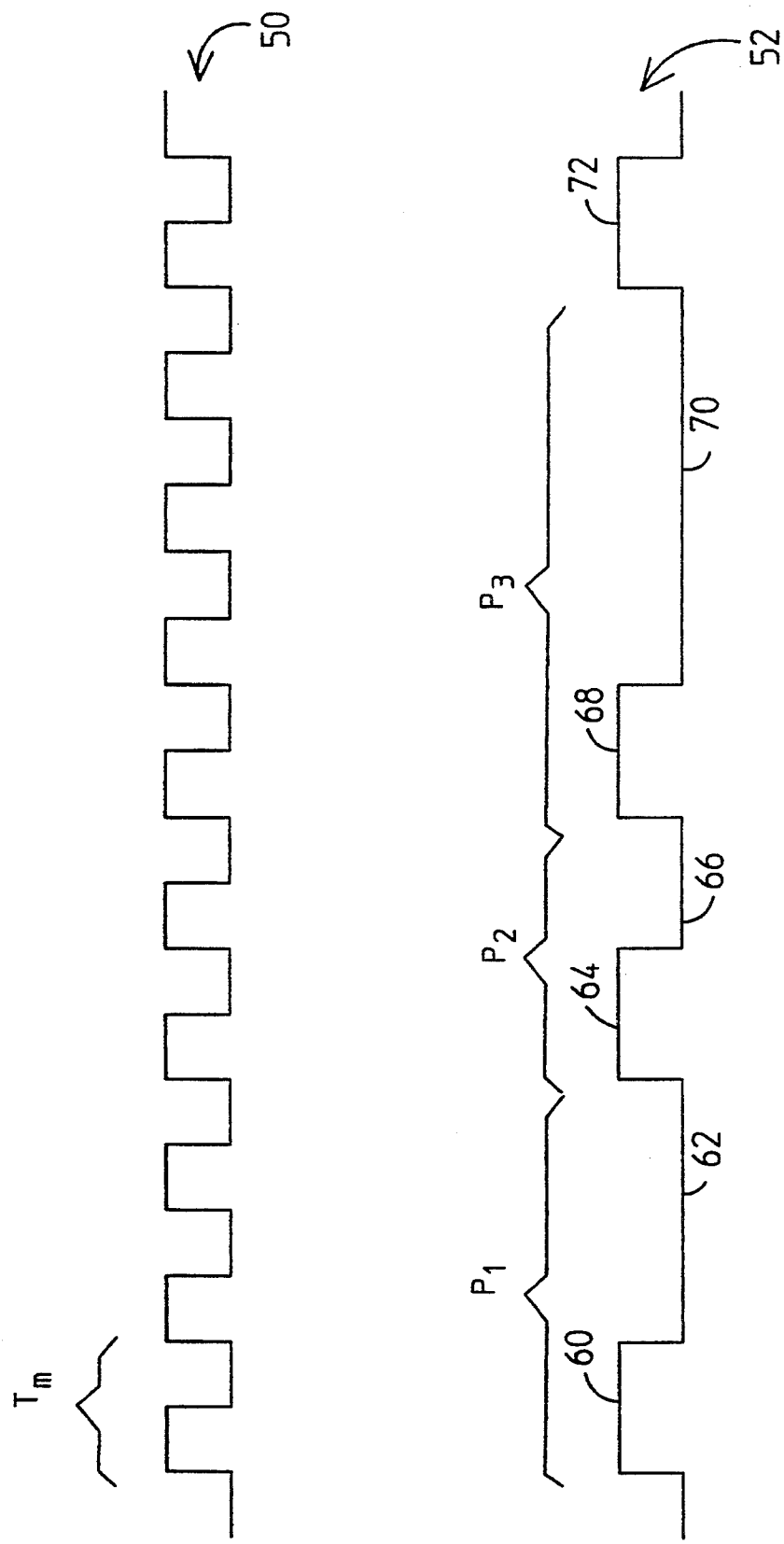
FIG. 2 shows a timing diagram indicating the levels of signals at various locations of the adaptive clock generation system of FIG. 1.

Refer now to FIG. 2, which shows a timing diagram of various signals in the system 10. The upper line 50 represents the signal of the master clock 12. The period $T_m$ of the master clock 12 (FIG. 1) is shown as one complete cycle. The lower line 52 represents the output signal from the programmable pulse generator 14 which is also the output of the adaptive clock generating system 10. The first period $P_1$ of the output signal has a high pulse 60 one master clock period $T_m$ wide followed by a low 62 being two master clock periods wide. The second period $P_2$ has a high pulse 64 and a low 66, both being one master clock periods wide. Similarly, the third period $P_3$ has a high 68 one master clock period in width followed by a low 70 being three master clock periods wide. A subsequent high pulse 72 starts another period.

The output frequency $F_a$ is related to the master clock frequency $F_m$ and the control output N according to the following equation:

$$F_a = F_m/(1+N) \quad (1)$$

Thus, if the master clock frequency is 24 MHz, then the periods of $P_1$, $P_2$, and $P_3$ are ⅛ MHz, 1/12 MHz, and 1/6 MHz, respectively.

The timing diagram of FIG. 2 shows the high pulses 60, 64, 68, and 72 being one master clock period $T_m$ wide. This need not be the case. The high pulse could be another known length without losing the benefit of the present invention.

Referring again to FIG. 1, the function block 16 provides the value N to the programmable pulse generator 14 based on certain inputs the function block receives. One input to the function block is the SAMPLE input 18 which tells the function block when to provide the next control output N. The SAMPLE input is the output of the programmable pulse generator. Another input is the ACCESS input 20, which informs the function block 16 when the processor (not shown) is accessing memory. Another input is the INTERRUPT input 22, which informs the function block when the processor is processing an interrupt routine. Yet another input is the MODE input 24, which provides for processor or manual control of the clock frequency.

In response to the ACCESS input 22, the function block 16 provides a control output N which decreases the adaptive frequency to a frequency which allows for memory access without requiring wait states. This slower frequency is greater than the effective frequency which results from adding one or two wait states with a fixed system frequency. Furthermore, since power consumption typically is proportional to frequency, the decrease in frequency during memory access reduces power consumption as well as radiated emissions.

In response to the INTERRUPT input 22, the function block 16 provides a control output N which increases the adaptive frequency. Preferably, N will equal 1, resulting in an adaptive clock frequency which is one-half the master clock frequency $F_m$. This allows for quicker response during what may be a time-critical interrupt.

In response to the MODE inputs 24, the function block provides a fixed control output N. Preferably, the MODE input 24 is a multi-line input, allowing for selection among a number of possible control outputs. The MODE inputs allow the default N to be changed or fixed, thereby preventing changes to N even during access and interrupts. However, if proper operation is to result from a fixed N, N must be large enough to obviate wait states, or wait states must be added, when accessing slow memory.

One of the modes of the adaptive clock generator can include a dithering technique. When dithering, N is pseudo-randomly chosen for each clock cycle from a range of discrete values. The effective energy which is radiated is proportional to the square of the clock frequency. By varying the output clock frequency $F_a$, the average radiated energy is both reduced and spread over a wider frequency bandwidth. This also has the effect of decreasing the highest peaks of emitted energy.

The effective clock frequency $F_a$ is the average of the individual frequencies which would result from operating at each of the respective discrete values for N.

Figure 3:
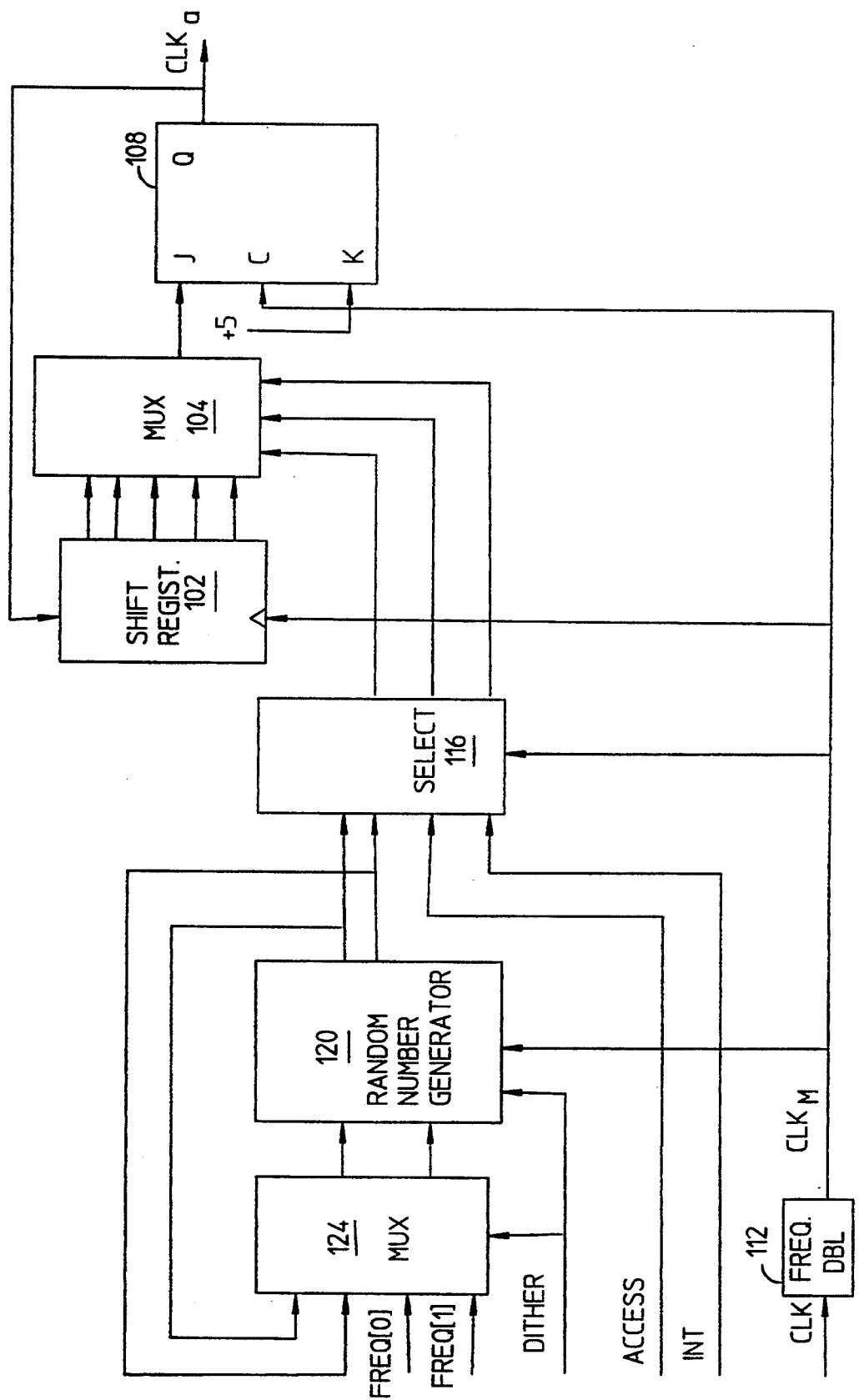
FIG. 3 shows a block diagram of a specific electronic circuitry for generating an adaptive clock signal.

Refer now to FIG. 3, where a more detailed block diagram of an adaptive clock generator is shown. A shift register 102, a multiplexer 104 and a JK flip-flop are connected to form a programmable pulse generator. The shift register has five locations, with all but one of the locations containing logical "zeros." The remaining location contains logical "one." The values contained in each register of the shift register are provided to the multiplexer 104.

The output of the multiplexer 104 is provided to the "J" input of the JK flip-flop 108. Its "K" input is tied high. Thus, when the output of the multiplexer 104 is low, the output of the flip-flop is reset low. A high pulse from the multiplexer 104 results in a corresponding high at the output of the JK flip-flop 108. The output of the flip-flop is the output adaptive clock signal $CLK_a$.

In response to a high pulse in the output clock signal $CLK_a$, the logical "one" in the shift register 102 is reset to the shift register's first register.

A clock signal CLK is doubled by a local frequency doubler 112 resulting in a high frequency master clock signal $CLK_m$. In one embodiment, the master clock signal has a frequency of 24 MHz. At each rising edge of the master clock signal $CLK_m$, the logical "one" in the shift register 102 shifts one register, thereby changing which input of the multiplexer 104 receives a high signal.

Controlling which input of the multiplexer 104 is provided to the flip-flop 108 also controls the number of cycles of the master clock signal $CLK_m$ which elapse until the logical "one" in the shift register 102 is supplied by the multiplexer 104 to the flip-flop 108 and thus, the time delay between the previous high pulse of the output clock signal $CLK_a$ and its next high pulse.

Thus, the output of the JK flip-flop 108 is a high pulse having a width of the master clock period $T_m$ followed by a low pulse having a width of N master clock periods. Because the shift register 102 has five locations, the value N can vary between one and five.

A select block 116 provides three control signals (corresponding to the value N of FIG. 1) to the multiplexer 104, controlling which one of the multiplexer's five input signals appears at its output. The select block receives as input two signals from a pseudo-random number generating circuit 120, a memory access signal ACCESS which goes high when the processor (not shown) is accessing memory, and an interrupt signal INT which goes high when the processor is executing an interrupt routine.

The pseudo-random number generator 120 receives two input signals from a second multiplexer 124. These two signals are either the output of the pseudo-random number generator or manual frequency control signals FREQ[0] and FREQ[1], depending on the state of the signal DITHER. When DITHER is high, the pseudo-random number generator receives its output from the second multiplexer 124 and the generator 124 operates as a pseudo-random number generator, providing a different pseudo-random number for each pulse of the master clock signal $CLK_m$. Alternatively, the pseudo-random number generator can be clocked by the output signal $CLK_a$ of the adaptive clock generator, resulting in fewer transitions in the pseudo-random number generator and thus reduced power consumption and radiated emissions.

When DITHER is low, the second multiplexer 124 provides the manual frequency control signals FREQ[0] and FREQ[1] to the pseudo-random number generator 120, which it passes on to the select circuit 116.

The select circuit 116 provides a binary number N to the multiplexer 104 based upon its inputs. If the processor is accessing memory as signified by a high ACCESS, then the select circuit provides an output N equal to two. This results in an adaptive clock frequency of 8 MHz. If the processor is executing an interrupt as signified by a high INT and ACCESS is low, then the select circuit provides an output N equal to one. This results in an adaptive clock frequency of 12 MHz. If DITHER is high, and both INT and ACCESS are low, then the select circuit maps the output of the random number generator 120 into randomly selected values N of one, three, four, or five. These values of N result in adaptive clock frequencies of 12 MHz, 6 MHz, 4.8 MHz, and 4 MHz, respectively, and an effective, or average, frequency of 6.7 MHz. Finally, if each of INT, ACCESS, and DITHER is low, then the select circuit provides values of N of one, three, four, or five, depending on the state of FREQ[0] and FREQ[1].

In pseudo code, the logic of select circuit 116 is:

```
switch N {
ACCESS:
    N = 2;
    break;
INTERRUPT:
    N = 1;
    break;
DITHER:
    N = pseudo-random selection of N values 1, 3,
        4, and 5;
    break
Default:
    N = N(FREQ[1:0]);
    break;
}
```

Although the present invention has been described in considerable detail with reference to certain preferred versions and values, other versions are possible. Other values for N may be used for different requirements of the processor. If slower memory or a faster master clock is used, N for accessing memory may need to be greater than two. A wider range of N values than four selections for dithering may be desired. The adaptive clock generator may not include some of the modes described. Additionally, the adaptive clock generator may be sensitive to conditions other than processor modes. For example, the adaptive clock may decrease its frequency after a certain period of time passes since the screen has been updated, or certain external events are detected.

Therefore, the spirit and scope of the appended claims should not be limited to the description of the preferred versions contained herein.

What is claimed is:

1. A method in an adaptive clock generating system for providing an adaptive clock signal to a digital circuit having a processor and memory, said method comprising the steps of:
   initializing said adaptive clock signal to operate at a first clock frequency;
   determining that said processor is accessing said memory;
   decreasing said first clock frequency to a second clock frequency in response to said determining step;
   returning to said first clock frequency when said memory is no longer being accessed;
   detecting that said processor is processing an interrupt routine;
   increasing said first clock frequency to a third clock frequency in response to said detecting step; and
   returning to said first clock frequency when said interrupt routine has been processed.

2. An adaptive clock generating system for providing an adaptive clock signal to a digital circuit having a processor and memory, said system comprising:
   means for initializing said adaptive clock signal to operate at a first clock frequency;
   means for determining that said processor is accessing said memory;
   means for decreasing said first clock frequency to a second clock frequency in response to said determining means;
   means for returning to said first clock frequency when said memory is no longer being accessed;
   means for detecting that said processor is processing an interrupt routine;
   means for increasing said first clock frequency to a third clock frequency in response to said detecting step; and
   means for returning to said first clock frequency when said interrupt routine has been processed.

3. The adaptive clock generating system of claim 1, wherein said first clock frequency varies in a pseudo-random manner to reduce the average radiated energy from said adaptive clock generating system.

4. The adaptive clock generating system of claim 2, wherein said first clock frequency varies in a pseudo-random manner to reduce the average radiated energy from said adaptive clock generating system.

* * * * *